(12) United States Patent
Ramcke et al.

(10) Patent No.: US 6,442,042 B2
(45) Date of Patent: Aug. 27, 2002

(54) CIRCUIT CONFIGURATION HAVING AT LEAST ONE NANOELECTRONIC COMPONENT AND METHOD FOR FABRICATING THE COMPONENT

(75) Inventors: Ties Ramcke, Müchen; Lothar Risch, Neubiberg; Wolfgang Rösner, Ottobrunn, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/883,901

(22) Filed: Jun. 18, 2001

Related U.S. Application Data

(63) Continuation of application No. PCT/DE99/03831, filed on Dec. 1, 1999.

(30) Foreign Application Priority Data

Dec. 18, 1998 (DE) .......................... 198 58 759
Jun. 16, 2000 (DE) .......................... 160 28 987

(51) Int. Cl.$^7$ ................................. H05K 7/02
(52) U.S. Cl. ..................... 361/760; 361/792; 361/764; 361/783; 174/255; 257/700; 257/701; 257/702
(58) Field of Search ................... 361/760, 792, 361/793, 794, 795, 783, 764, 761; 174/255, 262, 264; 257/698, 700, 701, 702; 439/268

(56) References Cited

U.S. PATENT DOCUMENTS

| 5,049,978 | A | * | 9/1991 | Bates et al. .................... 357/74 |
| 5,208,719 | A | * | 5/1993 | Wei ............................ 257/355 |
| 5,352,998 | A | * | 10/1994 | Tanino ........................ 257/686 |
| 5,757,072 | A | * | 5/1998 | Gorowitz et al. ............ 257/700 |

* cited by examiner

Primary Examiner—David S. Martin
Assistant Examiner—Hung Bui
(74) Attorney, Agent, or Firm—Laurence A. Greenberg; Werner H. Stemer; Gregory L. Mayback

(57) ABSTRACT

At least one CMOS component which is configured in a semiconductor substrate is part of the inventive circuit assembly. An insulating layer is configured on the semiconductor substrate. The insulating layer covers the CMOS component. A nanoelectronic component is configured above the insulating layer. At least one conducting structure is configured in the insulating layer and serves to link the nanoelectronic component with the CMOS component. If several nanoelectronic components are provided, they are preferably grouped to nano-circuit blocks. Each of the nano-circuit blocks is so small that the RC times of their lines do not exceed 1 ns.

12 Claims, 1 Drawing Sheet

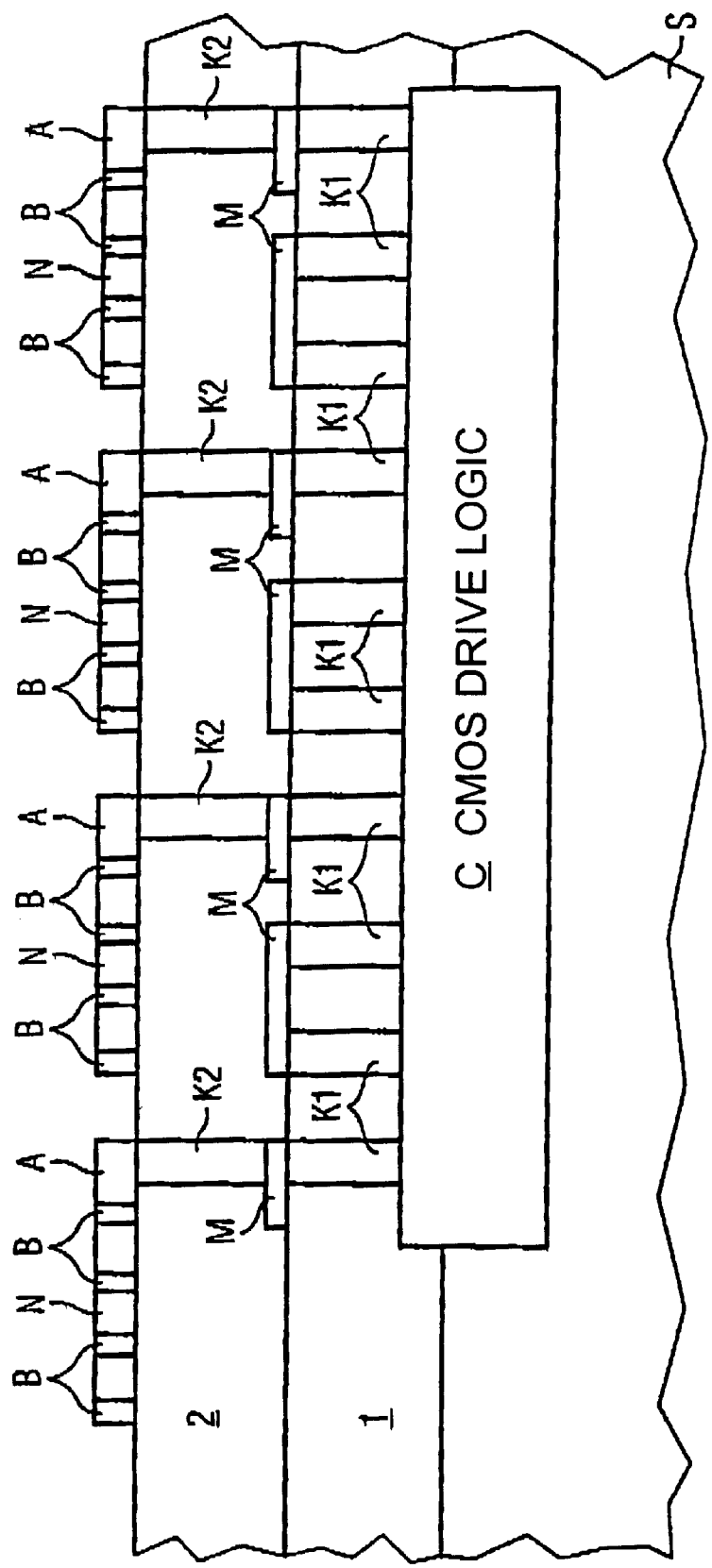

CIRCUIT CONFIGURATION HAVING AT LEAST ONE NANOELECTRONIC COMPONENT AND METHOD FOR FABRICATING THE COMPONENT

CROSS-REFERENCE TO RELATED APPLICATION

This application is a continuation of copending International Application No. PCT/DE99/03831, filed Dec. 1, 1999, which designated the United States.

BACKGROUND OF THE INVENTION

Field of the Invention

The invention relates to a circuit configuration having at least one nanoelectronic component and a method for fabricating the component.

In order to produce a circuit configuration with an ever higher packing density, dimensions of a component of the circuit configuration will probably measure just a few nanometers in the very foreseeable future. An example of such a so-called nanoelectronic component is a single-electron component in which circuit operations are realized by individual electrons. C. D. Chen et al., "Aluminium single-electron nonvolatile floating gate memory cell", Appl. Phys. Lett. 71 (14) (1997) 2038 describes a single-electron transistor which is essentially produced from aluminum.

Nanoelectronic components may also be biological nerve cells or molecular-electronic structures (see e.g. C. M. Fischer et al., "Organic Quantum Wells: Molecular Rectification and Single-Electron Tunnelling", Europhys. Lett. 28, 129 (1994)).

In general, nanoelectronic components are proposed which are fabricated using a very different technology from conventional CMOS components.

F. G. Pikus et al., "Nanoscale field-effect transistors: An ultimate size analysis", Appl. Phys. Lett. 71 (25) (1997) 3661, investigate a nanoelectronic CMOS component.

K. Yano et al., "A Room-Temperature Single-Electron Memory Device Using Fine-Grain Polycrystalline Silicon", IEDM (1993) 541, disclose a nanoelectronic memory cell including a transistor. Source, drain and channel regions of the transistor are produced by patterning an amorphous silicon layer having a thickness of 4 nm. Grains of the silicon layer have horizontal dimensions of approximately 10 nm. The channel region and a gate electrode of the transistor are surrounded by $SiO_2$. If the transistor is operated with low current, then a narrow channel forms in the channel region, which channel includes a chain of grains between which individual electrons tunnel. The threshold voltage of the transistor can be changed analogously to an EEPROM, which corresponds to programming of the memory cell. In order to program e.g. a logic 1, the voltage at the gate electrode, which acts as control gate electrode, is increased to an extent such that electrons hop to grains of the channel region which lie outside the channel, and remain there. The charged grains act analogously to a floating gate electrode of the EEPROM, so that the threshold voltage of the transistor is altered.

SUMMARY OF THE INVENTION

It is accordingly an object of the invention to provide a circuit configuration having at least one nanoelectronic component and a method for fabricating the circuit configuration which overcomes disadvantageous of the prior art apparatus and methods of this general type.

With the foregoing and other objects in view there is provided, in accordance with the invention a circuit configuration having at least one nanoelectronic component, in which the circuit configuration includes: a semiconductor substrate; and a CMOS circuit that is configured in the semiconductor substrate. The CMOS circuit includes at least one CMOS component. An insulating layer is configured on the semiconductor substrate and covers the CMOS component. A first nanoelectronic component is configured above the insulating layer. Conductive structures are configured in the insulating layer. At least one of the conductive structures connect the first nanoelectronic component to the CMOS component. A plurality of nano-switching blocks are configured above the insulating layer. Each one of the plurality of the nano-switching blocks are defined by a group of further nanoelectric components. Each one of the plurality of the nano-switching blocks has lines with RC times that interconnect the further nanoelectric components of the one of the plurality of the nano-switching blocks. Each one of the plurality of the nano-switching blocks has a size such that the RC times of the lines are not greater than 1 ns. A first drive circuit for the plurality of the nano-switching blocks is provided in which the first drive circuit is defined by the CMOS circuit. A plurality of second drive circuits is provided. Each one of the plurality of the nano-switching blocks is adjoined by a respective one of the plurality of the second drive circuits that is connected between the one of the plurality of the nano-switching blocks and the CMOS circuit. The conductive structures connect the CMOS circuit to the plurality of the second drive circuits. One of the plurality of the second drive circuits combines the lines of the one of the plurality of the nano-switching blocks such that a number of the conductive structures that are connected to the one of the second drive circuits is less than a number of the lines of the one of the plurality of the nano-switching blocks.

With the foregoing and other objects in view there is provided, in accordance with the invention a method for fabricating a circuit configuration, which includes steps of: providing a semiconductor substrate; using a CMOS method to produce at least one CMOS component in the semiconductor substrate; after producing the CMOS component, applying an insulating layer on the semiconductor substrate and covering the CMOS component with the insulating layer; producing a conductive structure in the insulating layer and connecting the conductive structure to the CMOS component; and using a nano-pattering technique to produce a nanoelectronic component above the insulating layer such that the nanoelectronic component is connected to the CMOS component by the conductive structure.

The circuit configuration has a high packing density since the CMOS component is configured under the nanoelectronic component.

The invention enables the integration of nanoelectronic components into microelectronic products.

Since the nanoelectronic component is not produced until after the CMOS component has been produced, it is not attacked by the method steps for producing the CMOS component. The nano-patterning technique may differ from the conventional CMOS methods.

In accordance with an added feature of the invention, the circuit configuration may include further nanoelectronic components. In order to increase the packing density, the nanoelectronic components are configured as close together as possible. For a given number of nanoelectronic components which are interconnected by lines, the dense configuration causes the lines to be shortened. This is advantageous since resistances of the lines are reduced. On the one hand, this means a smaller energy loss in the circuit configuration. On the other hand, the product of the resistance and the capacitance of the lines, the so-called RC time, is likewise small, so that changes in the voltages of the lines take place more quickly, and the circuit configuration switches more quickly.

In order to realize short lines despite a large number of nanoelectronic components, it is advantageous to group the nanoelectronic components into nano-switching blocks. A nano-switching block is a configuration of adjacent nanoelectronic components which are interconnected by lines having nanomete-wide cross sections. Although the grouping increases the number of lines of the circuit configuration, by the same token the lines are shorter. Furthermore, the grouping facilitates the dissipation of heat from the circuit configuration.

In accordance with an additional feature of the invention, the nano-switching blocks are each so small that the RC times of their lines are not longer than 1 ns. Using the conductive structure and further conductive structures configured in the insulating layer, the nano-switching blocks are connected to a CMOS circuit, which includes the CMOS component. Preferably, each nano-switching block is connected to the CMOS circuit through at least one of the conductive structures. A further advantage of the invention is manifested here: since the CMOS circuit is configured under the nano-switching blocks, and not beside them, for example, the conductive structures do not run in the two-dimensional plane in which the nano-switching blocks are configured, but rather run, at least partly, perpendicularly to the plane. Consequently, the conductive structures have more space, so that the nano-switching blocks can be configured at small distances from one another, which leads to a greater packing density. It may be important, precisely when grouping the nanoelectronic components into a plurality of nano-switching blocks, for the conductive structures to be provided with a great deal of space. This is because a large number of small nano-switching blocks generally require a larger number of conductive structures than a large nano-switching block, since each of the nano-switching blocks is separately connected to the CMOS circuit.

The CMOS circuit may be, for example, a first drive circuit for the nano-switching blocks.

In accordance with another feature of the invention, a plurality of second drive circuits are provided. In order to reduce the number of conductive structures which are connected to the nano-switching blocks, it is advantageous to configure, adjoining each nano-switching block, a second drive circuit which is connected between the nano-switching block and the first drive circuit. The second drive circuit combines the lines in the nano-switching block in such a way that the number of conductive structures connected to the second drive circuit is less than the number of lines. The conductive structures connect the first drive circuit to the second drive circuits. Such a hierarchical construction reduces the density of the conductive structures, so that the CMOS circuit can be produced in unstrained dimensions. The second drive circuit can be produced e.g. using the nano-patterning technique used to produce the nano-switching blocks.

In accordance with a further feature of the invention, the nano-switching blocks may be memory cell configurations, for example. A memory cell may be configured for example like a memory cell in accordance with C. D. Chen et al. (see above). The second drive circuit includes single-electron transistors, for example. The second drive circuit may, for example, combine bit lines of the nano-switching block in such a way that signals of the bit lines are forwarded sequentially to the first drive circuit. The first drive circuit determines which of the nano-switching blocks is addressed.

In accordance with another added feature of the invention, in order to connect CMOS components of the CMOS circuit to one another and to the nano-switching blocks, one or more metallization planes may be configured in the first insulating layer, the metallization planes being part of the conductive structures. Contacts, which are likewise parts of the conductive structures, are configured in the insulating layer and connect the first drive circuit to the metallization plane or the metallization plane to the second drive circuits.

In accordance with another additional feature of the invention, the metallization plane can be produced by first applying a lower part of the insulating layer. First contacts, which adjoin the CMOS circuit, are produced in the lower part of the insulating layer. The metallization plane is produced on the lower part of the insulating layer by conductive material being applied and patterned. An upper part of the insulating layer is subsequently applied. Second contacts, which adjoin the metallization plane, are produced in the upper part of the insulating layer. The nano-switching blocks are produced in such a way that they are connected to the second contacts.

In accordance with yet an added feature of the invention, the insulating layer can be applied in more than two parts, so that a plurality of contacts and a plurality of metallization planes can be produced.

In accordance with yet an additional feature of the invention, a part of the lines of the nano-switching block may be part of nano-metallization plane configured in the insulating structure. A nano-metallization plane is a metallization plane whose lines and contacts have dimensions of a few nanometers. The provision of such a metallization plane enables the crossing of the lines of the nano-switching block.

In accordance with yet another feature of the invention, in order to produce the nanoelectronic component, a layer may be applied on the insulating layer and patterned. The layer contains e.g. aluminum and is processed, as explained in C. D. Chen (see above).

In accordance with yet a further feature of the invention, the layer may also include titanium or niobium. In this case, the nanoelectronic component may be produced by partly oxidizing the layer with the aid of a scanning atomic force microscope, as is explained e.g. in K. Matsumoto, "STM/AFM Nano-Oxidation Process to Room-Temperature-Operated Single-Electron Transistor and Other Devices", Proc. IEEE 85, 612 (1997).

The construction of the nanoelectronic component is irrelevant to the invention. Thus, the nanoelectronic component may be e.g. a biological nerve cell, a molecular-electronic structure e.g. in accordance with C. M. Fischer et al. (see above), a CMOS component in accordance with F. G. Pikus et al. (see above) or a memory cell in accordance with K. Yano et al. (see above).

In accordance with a concomitant feature of the invention, the nanoelectronic component may have grains of conductive material which are enclosed by insulating material. Individual electrons can tunnel from grain to grain.

Other features which are considered as characteristic for the invention are set forth in the appended claims.

Although the invention is illustrated and described herein as embodied in a circuit configuration having at least one nanoelectronic component and method for fabricating the component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a memory including a substrate with a CMOS drive logic configuration, an insulating layer with a plurality of metallization planes and contacts and memory cell configurations, which are realized in the form of nano-switching blocks.

DESCRIPTION OF THE PREFERRED EMBODIMENTS

Referring now to the sole drawing figure in detail, there is shown an exemplary embodiment having a substrate S made of silicon that is provided as starting material. A CMOS drive logic configuration C is produced in the substrate S by means of a conventional CMOS method.

A first part 1 of an insulating layer is subsequently produced by depositing $SiO_2$ to a thickness of approximately 1500 nm and then planarizing the $SiO_2$ by chemical mechanical polishing.

Contact holes are produced in the first part 1 of the insulating layer by means of a photolithographic method. The contact holes are filled with tungsten, thereby producing first contacts K1.

A metallization plane M is produced by depositing and patterning aluminum, the metallization plane being connected to the first contacts K1.

In order to produce a second part 2 of the insulating layer, $SiO_2$ is deposited to a thickness of approximately 1000 nm and is planarized by chemical mechanical polishing. Contact holes are produced in the second part 2 of the insulating layer by means of a photolithographic method, so that parts of the metallization plane M are uncovered. The contact holes are subsequently filled with tungsten, thereby producing second contacts K2.

In order to produce a layer made of titanium, titanium is deposited to a thickness of approximately 3 nm. In order to produce tunneling barriers and insulating webs, the layer made of titanium is locally oxidized with the aid of a scanning atomic force microscope (AFM). To that end, a voltage of −10 V relative to the layer made of titanium is applied to the tip and the cantilever—connected thereto—of the AFM, which are conductive. The oxidation is electrochemical and is effected with the aid of an $H_2O$ film that is adsorbed on the layer made of titanium and the tip of the AFM.

As a result, nano-switching blocks N are produced from the layer made of titanium. The nano-switching blocks each include memory cells which are connected (represented diagrammatically in FIG. 1) to word lines and bit lines B having a width of approximately 10 nm. Furthermore, nano-drive circuits A are produced from the layer made of titanium. The nano-drive circuits include the bit lines B and the word lines in such a way that their signals are forwarded sequentially to the CMOS drive logic configuration C.

The metallization plane M, the first contacts K1 and the second contacts K2 form conductive structures which enable connection between the nano-switching blocks N and the CMOS drive logic configuration C.

We claim:

1. A circuit configuration having at least one nanoelectronic component, the circuit configuration comprising:

a semiconductor substrate;

a Complementary Metal-Oxide Semiconductor (CMOS) circuit configured in said semiconductor substrate, said CMOS circuit including at least one CMOS component;

an insulating layer that is configured on said semiconductor substrate and that covers said CMOS component;

a first nanoelectronic component that is configured above said insulating layer;

conductive structures that are configured in said insulating layer, at least one of said conductive structures connecting said first nanoelectronic component to said CMOS component;

a plurality of nano-switching blocks configured above said insulating layer, each one of said plurality of said nano-switching blocks defined by a group of further nanoelectronic components, each one of said plurality of said nano-switching blocks having lines with Resistance-Capacitance (RC) times that interconnect said further nanoelectronic components of said one of said plurality of said nano-switching blocks, each one of said plurality of said nano-switching blocks having a size such that said RC times of said lines are not greater than 1 ns;

a first drive circuit for said plurality of said nano-switching blocks, said first drive circuit defined by said CMOS circuit; and a plurality of second drive circuits, each one of said plurality of said nano-switching blocks being adjoined by a respective one of said plurality of said second drive circuits that is connected between said one of said plurality of said nano-switching blocks and said CMOS circuit;

said conductive structures connecting said CMOS circuit to said plurality of said second drive circuits;

one of said plurality of said second drive circuits combining said lines of said one of said plurality of said nano-switching blocks such that a number of said conductive structures that are connected to said one of said second drive circuits is less than a number of said lines of said one of said plurality of said nano-switching blocks.

2. The circuit configuration according to claim 1, wherein:

each one of said plurality of said nano-switching blocks is connected to said CMOS circuit by at least one of said conductive structures;

said first nanoelectronic component is part of one of said plurality of said nano-switching blocks; and at least one of said lines of said one of said plurality of said nano-switching blocks connects said first nanoelectronic component to one of said conductive structures.

3. The circuit configuration according to claim 2, comprising:

at least one metallization plane configured in said insulating structure, said metallization plane forming part of said conductive structures; and contacts forming parts of said conductive structures;

said contacts being configured in said insulating layer and in each case performing a connective function selected from the group consisting of connecting said CMOS circuit to said metallization plane and conecting said metallization plane to said plurality of said second drive circuits.

4. The circuit configuration according to claim 1, comprising:

at least one metallization plane configured in said insulating structure, said metallization plane forming part of said conductive structures; and contacts forming parts of said conductive structures;

said contacts being configured in said insulating layer and in each case performing a connective function selected from the group consisting of connecting said CMOS circuit to said metallization plane and connecting said metallization plane to said plurality of said second drive circuits.

5. The circuit configuration according to claim 1, wherein said first nanoelectronic component is formed mostly from a material selected from the group consisting of aluminum, titanium and niobium.

6. The circuit configuration according to claim 1, wherein said plurality of said nano-switching blocks are memory cell configurations.

7. A method for fabricating a circuit configuration, which comprises:

providing a semiconductor substrate;

using a CMOS method to produce at least one CMOS component in the semiconductor substrate;

after producing the CMOS component, applying an insulating layer on the semiconductor substrate and covering the CMOS component with the insulating layer;

producing a conductive structure in the insulating layer and connecting the conductive structure to the CMOS component; and using a nano-pattering technique to produce a nanoelectronic component above the insulating layer such that the nanoelectronic component is connected to the CMOS component by the conductive structure.

8. The method according to claim 7, which comprises applying at least one layer above the insulating layer and producing the nanoelectronic component in the layer that is above the insulating layer.

9. The method according to claim 8, which comprises:

producing further nanoelectronic components above the insulating layer such that the further nanoelectronic components are grouped into nano-switching blocks;

producing lines in each one of the nano-switching blocks such that the lines interconnect the further nanoelectronic components of the one of the nano-switching blocks;

producing a CMOS circuit having a CMOS component configured in the semiconductor substrate;

producing further conductive structures in the insulating layer so that the nano-switching blocks are connected to the CMOS circuit by the conductive structure and the further conductive structures;

producing the nanoelectronic component as part of one of the nano-switching blocks;

producing at least one of the lines of the one of the nano-switching blocks to connect the nanoelectronic component to the conductive structure.

10. The method according to claim 7, which comprises:

producing further nanoelectronic components above the insulating layer such that the further nanoelectronic components are grouped into nano-switching blocks;

producing lines in each one of the nano-switching blocks such that the lines interconnect the further nanoelectronic components of the one of the nano-switching blocks;

producing a CMOS circuit having a CMOS component configured in the semiconductor substrate;

producing further conductive structures in the insulating layer so that the nano-switching blocks are connected to the CMOS circuit by the conductive structure and the further conductive structures;

producing the nanoelectronic component as part of one of the nano-switching blocks;

producing at least one of the lines of the one of the nano-switching blocks to connect the nanoelectronic component to the conductive structure.

11. The method according to claim 10, which comprises:

first, applying a lower part of the insulating layer;

defining the conductive structure and the further conductive structures as a plurality of conductive structures;

in the lower part of the insulating layer, producing first contacts that adjoin the CMOS circuit and that form parts of the plurality of the conductive structures;

producing a metallization plane on the lower part of the insulating layer such that the metallization plane forms part of the plurality of the conductive structures and the metallization plane is connected to the first contacts;

applying an upper part of the insulating layer;

producing second contacts in the upper part of the insulating layer such that the second contacts are connected to the metallization plane and form parts of the plurality of the conductive structures; and connecting the nano-switching blocks to the second contacts.

12. The method according to claim 7, wherein the layer includes a material selected from the group consisting of aluminum, titanium and niobium.

* * * * *

UNITED STATES PATENT AND TRADEMARK OFFICE
CERTIFICATE OF CORRECTION

PATENT NO. : 6,442,042 B2  Page 1 of 1
DATED : August 27, 2002
INVENTOR(S) : Ties Ramcke et al.

It is certified that error appears in the above-identified patent and that said Letters Patent is hereby corrected as shown below:

<u>Title page,</u>
Item [30], should read:
-- Foreign Application Priority Data
Dec. 18, 1998 (DE) ………..…….. 198 58 759.7 --.

Signed and Sealed this

Thirtieth Day of May, 2006

JON W. DUDAS
*Director of the United States Patent and Trademark Office*